United States Patent [19]

Eumurian

[11] Patent Number: 5,245,278
[45] Date of Patent: Sep. 14, 1993

[54] DEVICE FOR THE PROCESSING OF A SIGNAL COMING FROM A SENSOR WITH A DERIVATIVE TYPE OF RESPONSE

[75] Inventor: Grégoire Eumurian, Argenteuil, France

[73] Assignee: Thomson-CSF, Puteaux, France

[21] Appl. No.: 759,423

[22] Filed: Sep. 13, 1991

[30] Foreign Application Priority Data

Sep. 21, 1990 [FR] France ............................ 90 11679

[51] Int. Cl.[5] ............................................ G01R 31/34
[52] U.S. Cl. ................................. 324/225; 324/609; 324/76.44; 381/115; 381/99; 381/100
[58] Field of Search ............... 324/225, 609, 78 F; 318/621, 622; 381/57, 99, 100, 115

[56] References Cited

U.S. PATENT DOCUMENTS

| | | | |
|---|---|---|---|
| 3,628,129 | 12/1971 | Riley | 318/621 |
| 3,974,442 | 8/1976 | Savidge | 324/225 |
| 4,180,706 | 12/1979 | Bakgaard | 381/99 |
| 4,210,866 | 7/1980 | Paulson | 324/225 |
| 4,221,995 | 9/1980 | Barkman | 318/621 |
| 4,243,840 | 1/1981 | Kates | 381/99 |
| 4,295,006 | 10/1981 | Tanaka | 381/99 |
| 4,330,748 | 5/1982 | Holden | 324/225 |
| 4,423,289 | 12/1983 | Swinbanks | 381/99 |

FOREIGN PATENT DOCUMENTS

| | | |
|---|---|---|
| 0068394 | 1/1983 | European Pat. Off. . |
| 0149319 | 7/1985 | European Pat. Off. . |
| 2194081 | 2/1974 | France . |
| 2352304 | 12/1977 | France . |

OTHER PUBLICATIONS

"NFM-1 an aperiodic short-range field strength meter for the checking of HF working places", Radio Fernsehen Elektronik, vol. 25, No. 15, 1976, pp. 488-490, VEB Verlag Technik, Berlin.

Primary Examiner—Kenneth A. Wieder
Assistant Examiner—Jose M. Solis
Attorney, Agent, or Firm—Marmorek, Guttman & Rubenstein

[57] ABSTRACT

The disclosure relates to devices for the measurement of signals in the field of wideband phenomena. More precisely, a device is disclosed for the processing of electrical signals coming from a derivative type of sensor designed to measure an electrical or magnetic field, currents, surface charges or other derivative variables, said processing including the computation of the primitive of the part of said signal having a spectral frequency higher than a low frequency $f_1$, the device comprising:

means for the electronic integration of said signal, from a frequency $f_2$ higher than said low frequency $f_1$;

compensation means amplifying and integrating said signal between the frequencies $f_1$ and $f_2$. FIG. 2.

14 Claims, 2 Drawing Sheets

DEVICE FOR THE PROCESSING OF A SIGNAL COMING FROM A SENSOR WITH A DERIVATIVE TYPE OF RESPONSE

BACKGROUND OF THE INVENTION

1. Field of the Invention

The invention relates to devices for measuring signals in the field of wideband phenomena.

More precisely, the present invention relates to a device for the processing of signals coming from nuclear electromagnetic impulse sensors (EMI), lightning sensors or electromagnetic compatibility (EMC) sensors. Sensors such as these may consist of wideband sensors of electrical or magnetic fields, currents or surface charges, having a frequency response ranging from about 10–100 kHz to more than one GHz.

2. Description of the Prior Art

In a known way, these sensors may be either passive sensors or active sensors.

Passive sensors use sensing elements connected to a low-impedance load with a value of 50 Ω for example. The connection between the sensor and the load is usually made by a cable with the same impedance. The working principle of passive sensors is described, for example, in the article by Carl Baum, Edward Breen, Joseph Gilles, John O'Neill, Gary Sower, "Sensors for Electromagnetic Pulse Measurements both Inside and Away from Nuclear Source Regions", *IEEE Transactions on Antennas and Propagation*, Vol. AP-26, No. 1, January 1978.

Passive sensors such as these have a derivative response that requires processing to obtain the real shape of the signal to be measured. The processing consists in integrating the signal coming from the sensor, for example by means of an RC cell, and in amplifying the integrated signal by means of an amplifier with an impedance that is higher than the equivalent impedance of the integrator.

The main advantage of passive sensors is that they let through high frequencies which may go up to 10 GHz. Furthermore, passive sensors are simple to make. However, the drawback of such sensors is that they have reduced sensitivity.

Active sensors, by contrast, have an electrical field and magnetic field measuring sensitivity that is respectively up to 100 times and 3000 times greater than the sensitivity of passive sensors.

Active sensors of this type are described, for example, in Grégoire Eumurian, "Computer-assisted Control of EMP Measurement on Major Systems", *Proceedings of the 6th Symposium on Electromagnetic Compatibility*, Zurich, 1985.

Signals coming from an electrical field measuring active sensor are processed by a very high impedance (>1 MΩ) amplifier and, and for a magnetic field measuring active sensor, this processing is done by a high impedance coil with magnetic core.

Active sensors are suited to applications of up to 200–300 MHz but, for applications beyond these values, it becomes difficult to make their internal electronic circuitry.

Besides, this electronic circuitry results in bulkier sensors. This is contradictory to the rise in frequency and, hence, to the reduction in the wavelength.

SUMMARY OF THE INVENTION

An object of the present invention, notably, is to overcome the drawbacks of existing devices.

More precisely, a first object of the present invention is to provide a device for the processing of information delivered by a wideband passive sensor, notably designed to detect an electrical or magnetic field, a current or a surface charge, making it possible to obtain a sensitivity comparable to that of the active sensors while, at the same time, keeping the passband of the active sensor.

An additional aim of the present invention is that a device such as this should be simple to make, and should have low noise.

These goals, as well as others that shall appear here below, are achieved by means of a device for the processing of electrical signals coming from a derivative type of sensor designed to measure an electrical or magnetic field, currents, surface charges or other derivative variables, said processing including the computation of the primitive of the part of said signal having a spectral frequency higher than a low frequency $f_1$, the device comprising:

means for the electronic integration of said signal, from a frequency $f_2$ higher than said low frequency $f_1$;

compensation means amplifying and integrating said signal between the frequencies $f_1$ and $f_2$.

Preferably, said compensation means are mounted in line and downstream from said integration means.

Advantageously, said compensation means have an integration slope equal to that of said integration means.

Preferably, said integration slopes are −6 dB/octave slopes.

According to a preferred embodiment, said integration means are each constituted by at least one RC cell.

Advantageously, a high-pass filter, with a cut-off frequency $f_0$ lower than $f_1$, is also included in said processing device.

Preferably, the slope of the transfer characteristic of said high-pass filter is +6 dB/octave.

According to a preferred embodiment of the present invention, said low frequency $f_1$ is of the order of 100 kHz and said frequency $f_2$ is of the order of 10 MHz.

Advantageously, said compensation means include at least one wideband amplifier and/or at least one transistor.

The device according to the invention is preferably used for the processing of signals coming from a sensor of electrical fields, magnetic fields, currents and/or surface charges.

BRIEF DESCRIPTION OF THE DRAWINGS

Other features and advantages of the present invention shall appear from the following description of a preferred embodiment of the present invention, given by way of a non-restrictive example, and from the appended drawings of which.

MORE DETAILED DESCRIPTION

Figure 1:
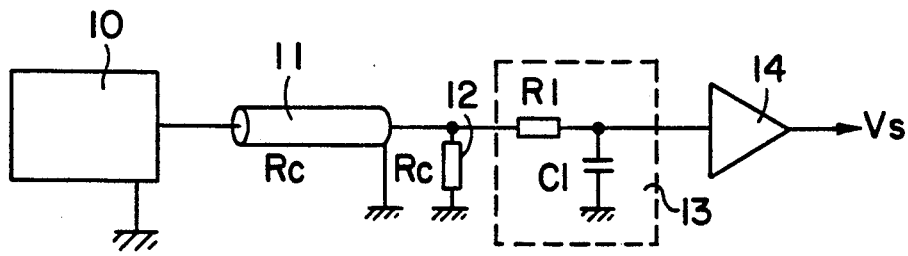
FIG. 1 shows a standard passive sensor associated with an integrator and an amplifier, according to a known embodiment.

FIG. 1 shows a standard passive sensor associated with an integrator and an amplifier according to a known embodiment.

The embodiment shown includes a sensor 10 connected to a load 12 with an impedance $R_c$ through a cable 11 having the same impedance.

The sensor 10 may notably be a sensor of electrical fields, magnetic fields, current, surface charges or other derivative variables. It has a derivative response that should therefore be integrated to obtain the measured value.

For example, for an electrical field sensor, the voltage delivered to the terminals of the load R is:

$$V = R_x Aeq \, \epsilon_0 \, dE/dt$$

with

R: impedance of the load
Aeq: equivalent area of the sensor
$\epsilon_0$: $10^{-9}/36\pi$ E: electrical field The signal coming from the sensor 10 is integrated by integration means 13 which may be formed, notably, by an $R_1C_1$ cell. The integration performed makes it possible to obtain the value of the signal measured by the derivative sensor 10.

The integrated signal may be followed by an amplifier 14, the input impedance of which is greater than that of the integrator 13 ($R_{input} >> R_1$).

The output voltage $V_s$ of the amplifier 14 is given by the relationship:

$$V_s = GR_c Aeq\epsilon_0 \frac{dE}{dt} \times \frac{1}{1 + R_1 C_1 p} \approx$$

$$GR_c Aeq\epsilon_0 \frac{dE}{dt} \times \frac{1}{R_1 C_1 p}$$

$$= GR_c Aeq\epsilon_0 \frac{E}{\tau_1}$$

with $\tau_1 = R_1 C_1 =$ time constant of the integrator 13,
G = gain of the amplifier 14.

In the case of a magnetic field sensor, the relationship giving the output voltage of the amplifier is:

$$V_S = G \, Aeq \, \mu_0 H / \tau_1$$

with:

H: magnetic field
$\mu = 4\pi \times 10^{-7}$

The integration is done from the frequency $f_1 = 1/2\pi R_1 C_1$ where $R_1 C_1 = \tau_1$.

Figure 2:
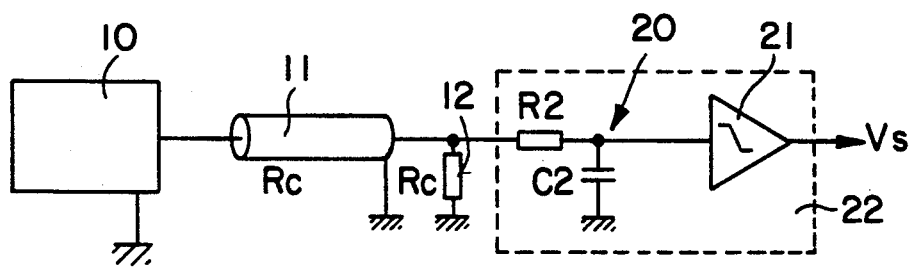
FIG. 2 shows an advantageous embodiment of the present invention, using a standard passive sensor associated with an integrator and a compensation module.

FIG. 2 shows an advantageous embodiment of the present invention, using a standard passive sensor associated with an integrator and with a compensation module.

A standard passive sensor 10 is connected to a load resistor 12, with a value $R_c$, through a cable 11 with an impedance $R_c$.

The signal received is processed by a device 22 comprising integration means 20 and compensation means 21.

The integration means 20 may notably consist of a low-pass type $R_2C_2$ cell. One of the characteristics of the invention is that the time constant $\tau_2$ equal to $R_2C_2$ is far smaller than the time constant $\tau_1$ of the known embodiment described in FIG. 1.

We thus have:

$$f_2 = 1/(2\pi R_2 C_2) >> f_1$$

The integration from the frequency $f_2$ which is greater than the frequency $f_1$ leads to a sensitivity of the device that is $f_2/f_1$ times greater. The low cut-off frequency has, however, gone from $f_1$ to $f_2$ and the signals coming from the derivative sensor 10 can no longer be integrated from the frequency $f_1$.

This is why the integration means 20 are followed by an amplifier 21, constituting compensation means, having a particular response, to compensate for the loss of the response at the low frequencies. Naturally, the amplifier 21 can also be located upstream from the integration means 20.

Figure 3:
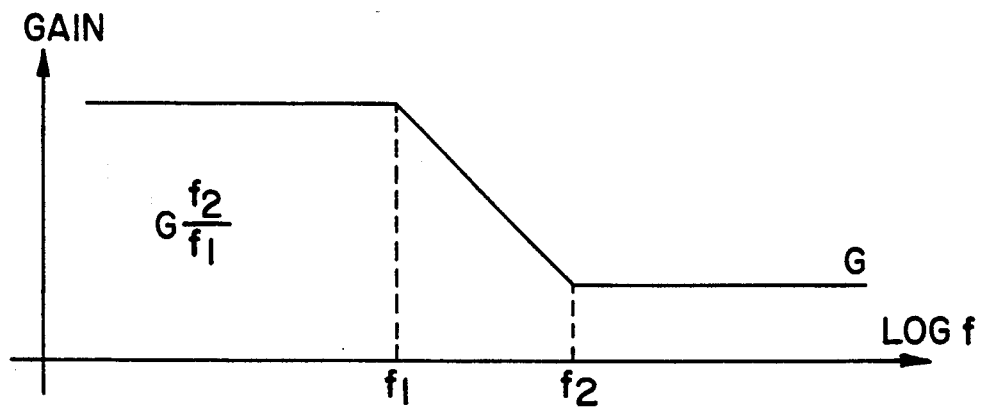
FIG. 3 shows a frequency response of the compensation module of FIG. 2.

FIG. 3 represents the frequency response of the amplifier 21.

The amplifier 21 has:

* A flat response of gain $G.f_2/f_1$ from 0 to $f_1$
* A $-6$ dB/octave slope from $f_1$ to $f_2$.
* a flat response of gain G from $f_2$.

This system of integration with a low time constant $\tau_2$ followed by a compensation of the low frequencies allows for a considerable gain in sensitivity without sacrificing the response at the low frequencies.

This gain is due to the fact that the prior art type of integration $\tau_1 = R_1 C_1$ (FIG. 1) can be used to obtain a good response at the low frequencies, at the cost of a notable diminishing of the sensor signal, while the proposed approach substantially reduces the factor by which the signal from the sensor is diminished, at the cost of a small increase in noise. For, since the integration constant $\tau_2$ is low, the amplitude of the output signal from the integrator 20 remains high up to $f_2$. The signal-to-noise ratio of the device of FIG. 2 is therefore greater than that of the assembly of FIG. 1.

This slight increase is produced by the increase in gain in the zone $f_1$-$f_2$.

The following two examples provide for assessing the gain in sensitivity for an electrical field sensor and a magnetic field sensor.

An electrical field sensor with an area $Aeq = 10^{-2} m^2$ connected to a load resistor ($R_2 = 50 \, \Omega$) is used with a standard processing device (FIG. 1) and then with a device according to the present invention (FIG. 2).

The processing devices should give a flat response from 100 kHz to 1 GHz.

The standard approach (FIG. 1) consists in integrating the signal coming from the sensor from 100 kHz onwards.

For a noise of about 100 $\mu$Veff at the input of the amplifier 14 with a gain G=1, we have:

$$V_S = R_c Aeq \, \epsilon_0 \, E/\tau_c$$

now $\tau_c = 1/2\pi \, f_c$ and hence for $f_c = 100$ KHz, $\tau_c = 1,6 \, \mu s$.

The noise at the output of the device is therefore:

$$E_{noise} = \frac{V_{noise} \times \tau_c}{R_c Aeq\epsilon_0} = \frac{100 \times 10^{-6} \times 1,6 \times 10^{-6}}{50 \times 10^{-2} \times 10^{-9}/36\pi} = 36 \, Veff/m$$

According to the invention (FIG. 2), the signal coming from the sensor is integrated from 10 MHz and the compensation is achieved from 100 kHz to 10 MHz.

The noise in the 10 MHz-1 GHz band is unchanged and is equal to 100 $\mu$Veff.

The noise in the 100 kHz-10 MHz band is equal, for a perfect filter, to:

$$100 \ \mu Veff. \ (100 \ KHz/1 \ GHz)^{\frac{1}{2}} = 1 \ \mu Veff$$

and for a filter with $-6$ dB/octave slope (first order), to:

$$1 \ \mu Veff. \ (\pi/2)^{\frac{1}{2}} = 1{,}25 \ \mu Veff$$

This noise is amplified with an additional gain of 10 MHz/100 kHz = 100

At the input, therefore, we have:

$$1.25.100 = 125 \ \mu Veff$$

The total noise at input is:

$$(100^2 + 125^2)^{\frac{1}{2}} = 160 \ \mu Veff$$

The electrical field noise becomes:

$$E_{noise} = \frac{160 \times 10^{-6} \times 1{,}6 \times 10^{-8}}{50 \times 10^{-2} \times 10^{-9}/36\pi} = 0{,}58 \ Veff/m$$

The noise has therefore fallen by 36 dB.

According to another mode of implementation, a magnetic field sensor with an equivalent area Aeq = $10^{-3}$ m$^2$ and $R_c = 50 \ \Omega$ is used in combination with a standard device (FIG. 1) and then in combination with a device according to the present invention (FIG. 2).

A flat response is desired from 100 kHz to 1 GHz.

The standard approach (FIG. 1) lies in integrating the signal coming from the derivative sensor from 100 kHz onwards. For a unit gain of the amplifier 14, the output voltage $V_s$ of the device is equal to:

$$V_s = Aeq\mu_0 H/\tau_c \ \text{with} \ V_{noise} = 100 \ \mu Veff$$

for $F_c = 100$ kHz, $\tau_c = 1.6 \ \mu$s, whence;

$$H_{noise} \frac{V_{noise} \times \tau_c}{Aeq\mu_0} = \frac{100 \times 10^{-6} \times 1{,}6 \times 10^{-6}}{} = 127 \ mA/m$$

According to the invention, the integration is achieved from 10 MHz onwards, and the compensation from 100 kHz to 10 MHz.

The total noise brought to the input is 160 $\mu$Veff.

$$H_{noise} = 127 \ mAeff \times \frac{160}{100} \times \frac{1}{100} = 2 \ mAeff/m$$

The same gain in sensitivity as with an electrical field sensor is obtained.

Figure 4:
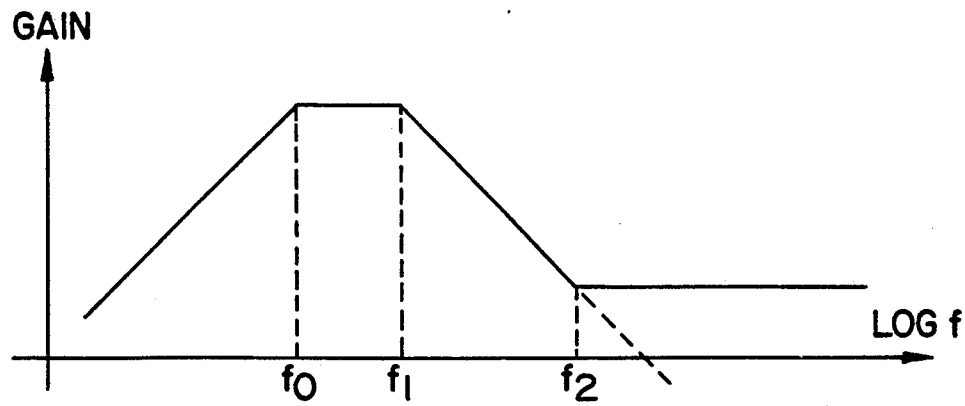
FIG. 4 shows the transfer characteristic of another embodiment of the present invention.

FIG. 4 shows the frequency response of another embodiment of the present invention.

The frequency zone 0 to $f_1$ is not used by the device according to the invention. By contrast, it produces noise that can be limited by placing a high-pass filter with a cut-off frequency $f_0$ in the processing chain, with $f_0$ lower than $f_1$. A filter such as this can be placed before or after the integration means 20 (FIG. 2) or else at output of the compensation means 21.

The transfer function of FIG. 4 is that of a high-pass filter combined with the compensation means 21.

If the integration means 20 are also taken into account, the transfer function is that shown in dashes starting at $f_2$.

For the two examples referred to here above, a high-pass filter with a cut-off frequency of 75 kHz can be used to bring the low frequency noise from 125 $\mu$Veff to: $125(25/100)^{\frac{1}{2}} = 62{,}5 \ \mu$Veff ($f_1$-$f_0$ = 100 − 75 = 25 kHz) giving a gain of 2.6 dB.

The transfer function shown in FIG. 4 is the one obtained with a first-order high-pass filter, but it is naturally possible to use a higher order filter.

Figure 5:
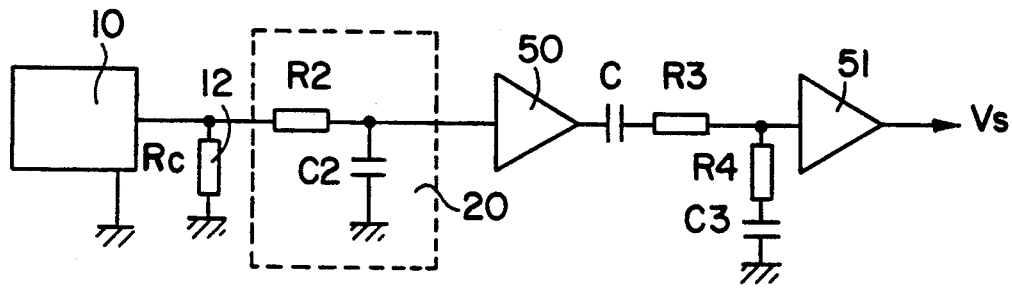
FIGS. 5 and 6 each show an exemplary embodiment of the device according to the present invention.
Figure 6:
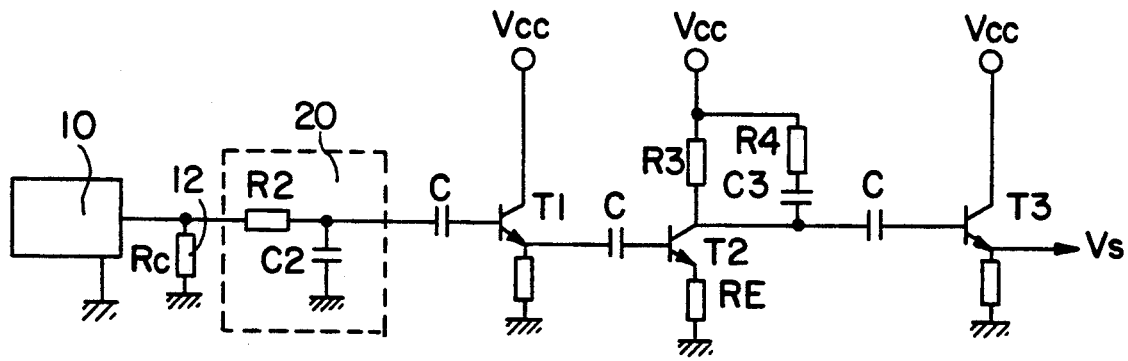

FIGS. 5 and 6 each show an exemplary embodiment of the device according to the present invention.

FIG. 5 shows a first advantageous embodiment of the device according to the present invention.

The device shown constitutes a chain for the processing of a signal coming from a derivative sensor 10. The cell 20 constitutes an integrator with a cut-off frequency $f_2 = \frac{1}{2}\pi R_2 C_2$.

The cell 20 is followed by an amplifier 50 with input impedance far greater than the equivalent impedance of the cell 20. The amplifier 50 has a higher gain than the ratio $f_2/f_1$.

A capacitor C connected in series at output of the amplifier 50 can be used to limit the frequency passbands below $f_1$ and thus further reduce the noise.

The capacitor C is followed by a transfer function filter $R_3 R_4 C_3$:

$$T(p) = R_4(p+\omega_2)/(R_3 + R_4)(p + \omega_1)$$

with $\omega_1 = 1/(R_3 + R_4)C_3 = 2\pi.f_1$ $\omega_2 = 1/R_4 C_3 = 2\pi.f_2$

The cut-off frequencies $f_1$ and $f_2$ of the filter can thus be adjusted separately.

The filter $R_3 R_4 C_3$ is followed by an amplifier 51 having an input impedance far higher than the equivalent impedance of the filter.

The amplifiers 50 and 51 are advantageously wideband amplifiers, but any other type of amplifier is also appropriate.

FIG. 6 shows another advantageous embodiment of the device according to the present invention.

For reasons of clarity, the bias resistors of the transistors $T_1$ to $T_3$ have not been shown.

The transistors $T_1$ and $T_3$ are mounted in common-collector connection and thus fulfil a follower (impedance matching) function.

The compensation means are constituted by the transistor $T_2$ and by the network $R_3 R_4 C_3$.

The gain of the transistor $T_2$ is given by the relationship:

$$Av = \frac{R_3 R_4}{R_3 + R_4} \times \frac{1}{R_E} \frac{p + \frac{1}{R_4 C_3}}{p + \frac{1}{C_3(R_3 + R_4)}} =$$

$$\frac{R_3 R_4}{(R_3 + R_4)R_E} \frac{p + \omega_2}{p + \omega_1}$$

with $\omega_1 = 1/C_3 (R_3 + R_4) \ et \ \omega_2 = 1/(R_4 C_3)$

The two capacitors C enable the band to be limited to below $f_1$ and thus enable the noise to be further reduced.

Naturally, FIGS. 5 and 6 show only two preferred embodiments of the present invention, and this device for the processing of signals coming from a derivative sensor can be made in different ways.

Furthermore, the transfer characteristic of the device may have greater slopes, notably slopes of $-12$ db/octave.

What is claimed is:

1. A device for processing a wideband electrical signal outputted from a wideband passive derivative type of sensor, which sensor outputs a wideband signal dependent on the derivative of a measured electromagnetic variable said outputted signal from said sensor having a frequency spectrum with frequency components above a predetermined low frequency $f_1$ of said sensor and below a predetermined high frequency $f_3$ of said sensor, the device comprising:

integration means for electronically integrating a part of said wideband signal containing a portion of said frequency spectrum above a predetermined intermediate frequency $f_2$, where $f_2$ is between said low frequency of said sensor $f_1$ and said high frequency of said sensor $f_3$, and where $f_2 >> f_1$, and, compensation means for amplifying said wideband signal and for integrating a part of said wideband signal containing a portion of said frequency spectrum between the frequencies $f_1$ and $f_2$, said compensation means having a gain which is a decreasing function of frequency in the frequency band between $f_1$ and $f_2$ and constant as a function of frequency between the intermediate frequency $f_2$ and the high frequency of the sensor $f_3$.

2. A device according to claim 1, wherein said compensation means is connected in series with, and downstream from, said integration means.

3. A device according to claim 1, wherein said compensation means and said integration means have equal integration slopes.

4. A device according to claim 2, wherein said compensation means and said integration means have equal integration slopes.

5. A device according to claim 3 wherein said integration slopes are $-6$ dB/octave slopes.

6. A device according to claim 1, wherein said integration means comprises at least one RC cell.

7. A device according to claim 1 also including a high-pass filter with a cut-off frequency $f_0$ lower than $f_1$.

8. A device according to claim 7, wherein a transfer characteristic of said high pass filter has a slope equal to $+6$ dB/octave.

9. A method for processing a wideband electrical signal outputted from a derivative type of wideband sensor, which sensor outputs a wideband signal dependent on the derivative of a measured electromagnetic variable, said outputted signal having a frequency spectrum with frequency components above a predetermined low frequency $f_1$ of said sensor and below a predetermined high frequency $f_3$ of said sensor, said method comprising the steps of:

using an electronic integration circuit, electronically integrating a part of said wideband signal containing a portion of said frequency spectrum above an intermediate frequency $f_2$, said intermediate frequency $f_2$ being inbetween said low frequency $f_1$ of said sensor and said high frequency $f_3$ of said sensor, wherein $f_2 >> f_1$; and using an electronic compensation circuit, electronically amplifying said wideband signal and integrating a part of said signal containing a portion of said frequency spectrum between the frequencies $f_1$ and $f_2$, said compensation circuit having a gain which is a decreasing function of frequency in the frequency band between $f_1$ and $f_2$ and a constant as a function of frequency between $f_2$ and $f_3$.

10. A device according to claim 1, wherein said low frequency $f_1$ is of the order of 100 kHz and said frequency $f_2$ is of the order of 10 MHz.

11. A device according to claim 1, wherein said compensation means includes at least one wideband amplifier.

12. A device according to claim 2, wherein said compensation means includes at least one wideband amplifier.

13. A device according to claim 1, wherein said compensation means includes at least one transistor.

14. A device according to claim 2, wherein said compensation means includes at least one transistor.

* * * * *